United States Patent [19]

Sugisaki et al.

[11] 4,008,432
[45] Feb. 15, 1977

[54] APPARATUS FOR DETECTING AN EXTERNAL MAGNETIC FIELD

[75] Inventors: Takao Sugisaki; Tatsushiro Ochiai; Kyoichi Nishikawa; Minoru Higurashi, all of Tokyo, Japan

[73] Assignee: TDK Electronics Company, Limited, Japan

[22] Filed: Dec. 26, 1973

[21] Appl. No.: 427,508

Related U.S. Application Data

[62] Division of Ser. No. 330,264, Feb. 7, 1973.

[30] Foreign Application Priority Data

Mar. 2, 1972 Japan .............................. 47-21787
Mar. 2, 1972 Japan .............................. 47-21788
Mar. 17, 1972 Japan .............................. 49-27242

[52] U.S. Cl. .......................... 324/43 R; 307/88 P; 340/347 P
[51] Int. Cl.² .................................. G01R 33/02
[58] Field of Search ....................... 324/34 R, 43 R; 273/54 E; 340/347 P; 308/88 P, 88 TF

[56] References Cited

UNITED STATES PATENTS

| | | | |
|---|---|---|---|
| 3,121,565 | 2/1964 | Mentzer et al. | 273/54 E |
| 3,197,763 | 7/1965 | Fisher | 340/347 P |
| 3,246,219 | 4/1966 | Devol et al. | 324/43 R |
| 3,453,614 | 7/1969 | Bose | 340/347 P |
| 3,718,872 | 2/1973 | Takeuchi | 324/43 R |
| 3,854,086 | 12/1974 | Watanabe et al. | 324/43 R |

FOREIGN PATENTS OR APPLICATIONS

| | | | |
|---|---|---|---|
| 4,535,595 | 11/1970 | Japan | 324/43 R |
| 909,023 | 10/1962 | United Kingdom | 324/41 |

OTHER PUBLICATIONS

Oshima et al., High Sensitivity Plated-Wire Sensor Using Second Harmonic Oscillation, AEEE Trans. On Magn.; 9/1971, pp. 436-437.

Primary Examiner—Robert J. Corcoran
Attorney, Agent, or Firm—Staas & Halsey

[57] ABSTRACT

Apparatus for detecting an external magnetic field comprises a magnetic sensor which produces paramagnetic oscillations and includes an elongated member of an electrically conductive material and a thin magnetic film disposed thereabout. Alternative embodiments of the invention are presented in each of which the detection of an external magnetic field by the sensor results in a change in the oscillating state. In a first embodiment, the sensor is maintained normally in an oscillating state of a given domain and thus a given phase; when the sensor is subjected to an external magnetic field of appropriate intensity and polarity, the magnetization of the sensor shifts from the first domain to the second domain and accordingly there is produced a change or reversal in phase of the oscillatory output derived from the sensor. In that change of phase, the sensor output passes through a zero voltage value which is detected for providing an indication of the sensing of the external magnetic field. In an alternative embodiment, the exciting magnetic field normally maintains the state of magnetization in a first domain producing a non-oscillating state of the sensor; an external magnetic field has the effect of switching the magnetization to an oscillation domain; the sensor accordingly switches from a non-oscillating state to an oscillating state in response to sensing the external magnetic field.

4 Claims, 34 Drawing Figures

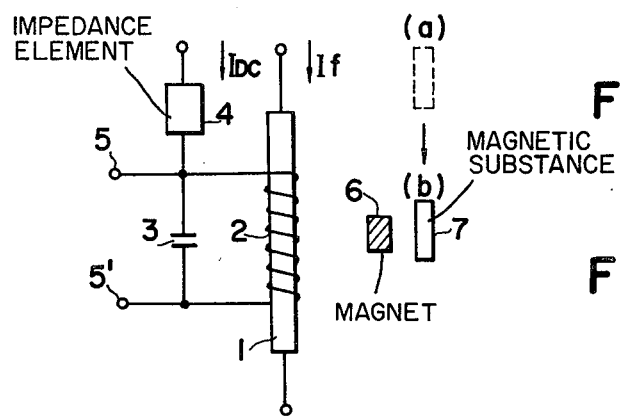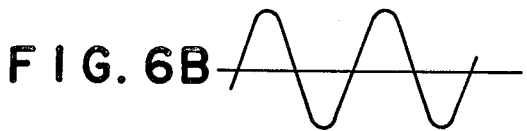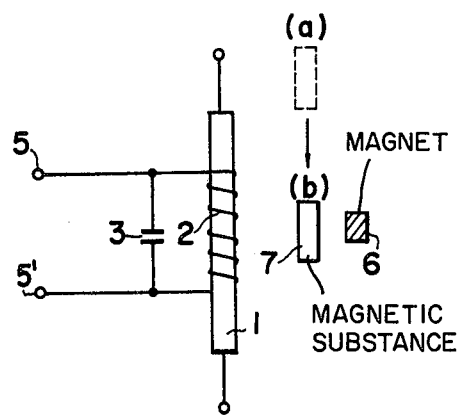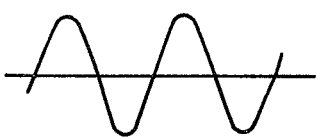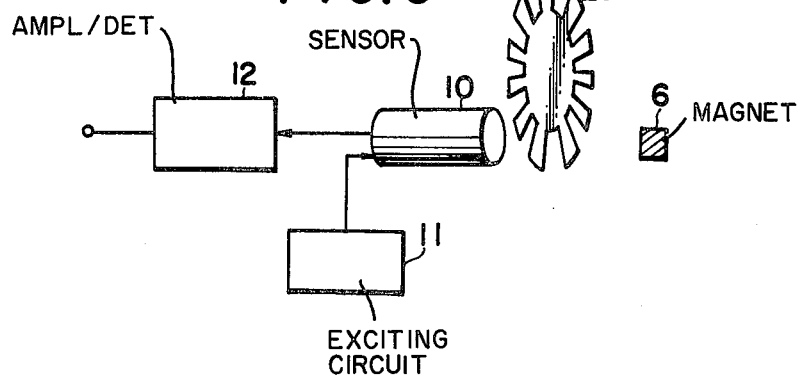

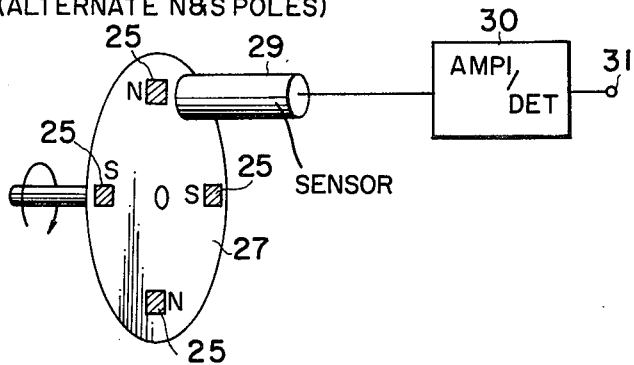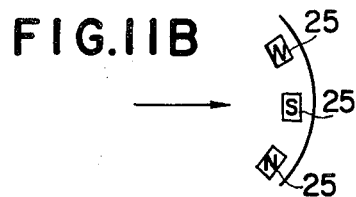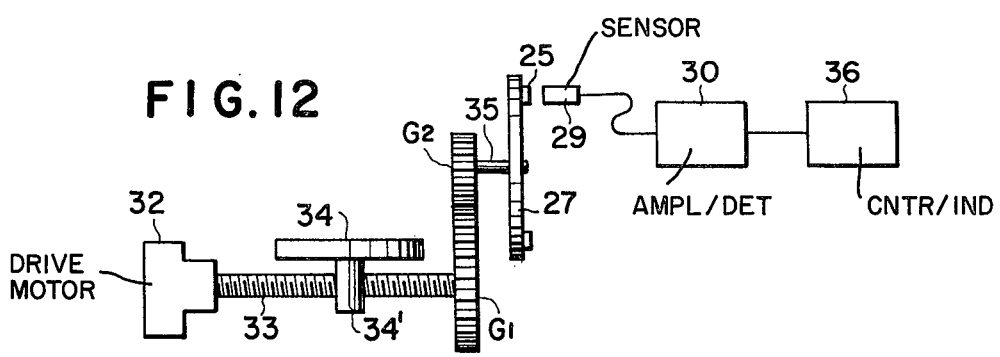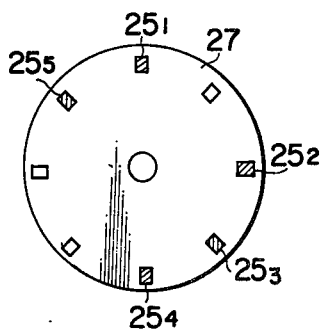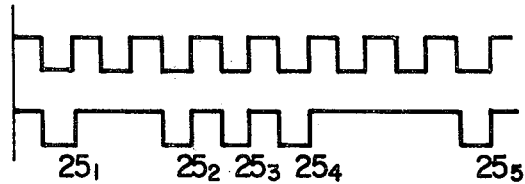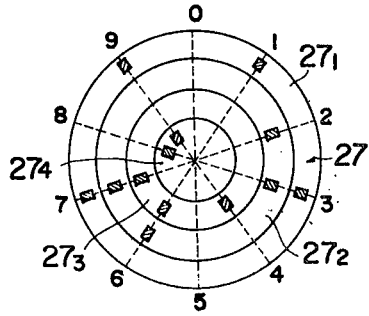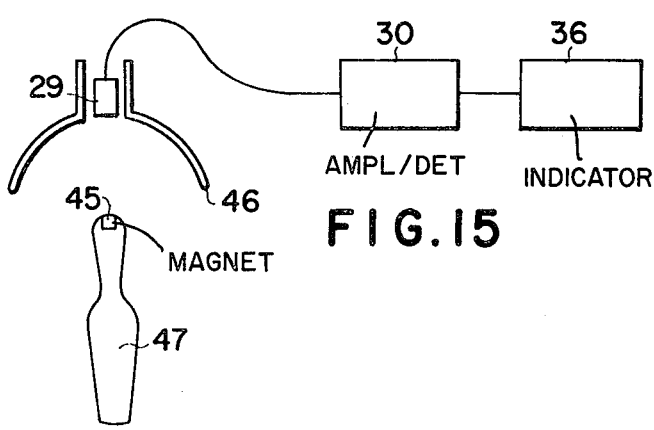

APPARATUS FOR DETECTING AN EXTERNAL MAGNETIC FIELD

This is a division of application Ser. No. 330,264, filed Feb. 7, 1973.

BACKGROUND OF THE INVENTION

1. Field of the Invention

This invention relates to a magnetic substance detecting device employing a magnetic sensor.

2. Description of the Prior Art

In the prior art, when a magnetic substance is brought to the vicinity of a reed switch, the reed switch is closed in response to a line of magnetic force of high density in the neighborhood to the surface of the magnetic substance, thus detecting the magnetic substance. However, since opening and closing of the reed switch take place at its contacts, it is likely to cause break down of the switch and, further, the opening and closing operation is achieved by the magnetic attracting force and spring action of iron pieces, so that an increase in sensitivity causes the operation to become unstable in terms of its characteristics and with respect to surrounding conditions. Therefore, it is necessary to lower the sensitivity for stabilizing the operation.

SUMMARY OF THE INVENTION

The principal object of this invention is to provide a magnetic substance detecting device which is free from the aforementioned defects experienced in the prior art and which is capable of detecting a magnetic substance with high sensitivity and with high reliability.

Briefly stated, the magnetic substance detecting device according to this invention comprises a detecting coil wound about a magnetic thin film plated wire of uniaxial magnetic anisotropy which has a magnetic hard axis in its axial direction and a magnetic easy axis in its circumferential direction. A magnetic substance to be detected is coupled with a magnetic or electrical circuit of a magnetic sensor capable of parametric oscillation which is associated with the oscillation domain of the magnetic wire, by which the oscillating conditions of the detecting coil, that is, its oscillating and standstill (i.e., non-oscillating) conditions are reversed or the phase of oscillations are reversed, thereby to detect the magnetic substance.

BRIEF DESCRIPTION OF THE DRAWINGS

This invention will be more fully understood by the following description and the attached drawings, in which:

FIG. 5 is a schematic diagram showing the construction of one example of a magnetic substance detecting device of this invention;

FIGS. 6A and B show waveforms, for explaining an oscillation output waveform of the example of FIG. 5;

FIG. 7 is a schematic diagram illustrating the construction of another example of a magnetic substance detecting device of this invention;

FIGS. 8A and B show waveforms, for explaining an oscillation output waveform of the example of FIG. 7;

FIG. 9 is a schematic diagram illustrating another example of this invention as being applied to a pulse generator;

FIGS. 10 and 11A and B are schematic diagrams, for explaining the construction and principle of another example of this invention as being applied to an analog-to-digital converter;

FIG. 12 is a schematic diagram illustrating the construction of the example of FIG. 10;

FIGS. 13A, B and C and 14 are diagrams, for explaining the function of the construction of FIG. 12;

FIG. 15 schematically shows a modified form of the construction of FIG. 10;

DESCRIPTION OF THE PREFERRED EMBODIMENTS

Figure 1:
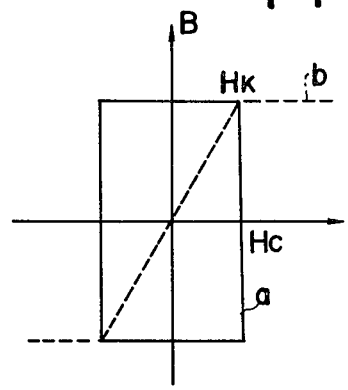
FIGS. 1 to 4, inclusive, are diagrams for explaining the principle of a magnetic sensor for use in the present invention.

The general magnetization characteristics of a ferromagnetic thin film plated wire of uniaxial magnetic anisotropy are shown in FIG. 1, in which reference characters A and B designate the magnetization characteristics, respectively in the direction of a magnetic easy axis, that is, in the circumferential direction of the wire and in the direction of a magnetic hard axis, that is, in the axial direction of the wire. For convenience of explanation, the directions of the axes of easy and hard magnetization will hereinafter be identified by $x$ and $y$ respectively. The intensity of the magnetic field $Hk$ at a point of reversal or saturation of magnetization in each direction is equal to that in the other direction. Usually, the coercive force $Hc$ is lower than $Hk$. Where the magnetic thin film is sufficiently thin, magnetization is present only in the two-dimensional plane of the flim surface and it does not take place in the direction of the thickness of the film, so that it is sufficient to handle the magnetization mechanism only in two dimensions.

Figure 2A:
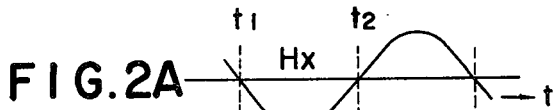
Figure 2B:
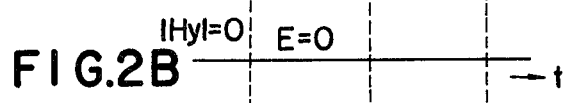
Figure 2C:
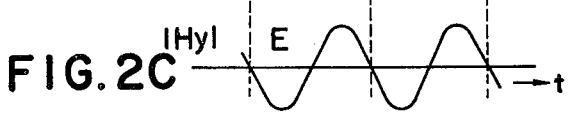
Figure 3A:
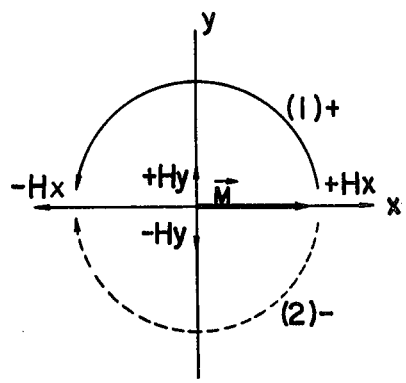

The magnetic field $Hx$ shown in FIG. 2A is produced in the two-dimensional plane by flowing an input exciting current through the magnetic wire. The intensity of the magnetic field $Hx$ is selected to be such that, in the absence of the magnetic field applied in an direction $y$, the output voltage from a winding cannot be detected as shown in FIG. 2B. FIG. 2C illustrates the waveform of an output voltage E of parametric oscillation of a frequency twice as high as the exciting current in the presence of the magnetic field being applied in the direction $y$. FIGS. 3A and B show diagrams, for explaining the mechanism of magnetization in the two-dimensional plane of the magnetic thin film. At a time $t_1$ indicated in FIG. 2 at which the magnetic field is reversed from positive to negative, a magnetization vector $\vec{M}$ passes along a path 1 or 2 as shown in FIG. 3A to effect the inversion of magnetization. If a magnetic field of sufficient intensity $|Hy|$ exists in the direction $y$ at $t_1$ and $t_2$, the magnetization vector $\vec{M}$ is induced by the magnetic field $|Hy|$ to pass along the path 1 or 2. The output produced by the induced voltage becomes such as indicated by $E_1$ or $E_2$ in FIG. 3B according as the magnetization vector $\vec{M}$ has passed along the path 1 or 2, respectively. The outputs $E_1$ and $E_2$ are opposite only in polarity to each other but exactly equal in amplitude and waveform to each other.

Figure 3B:
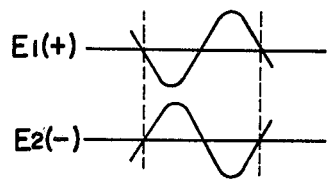
Figure 4:
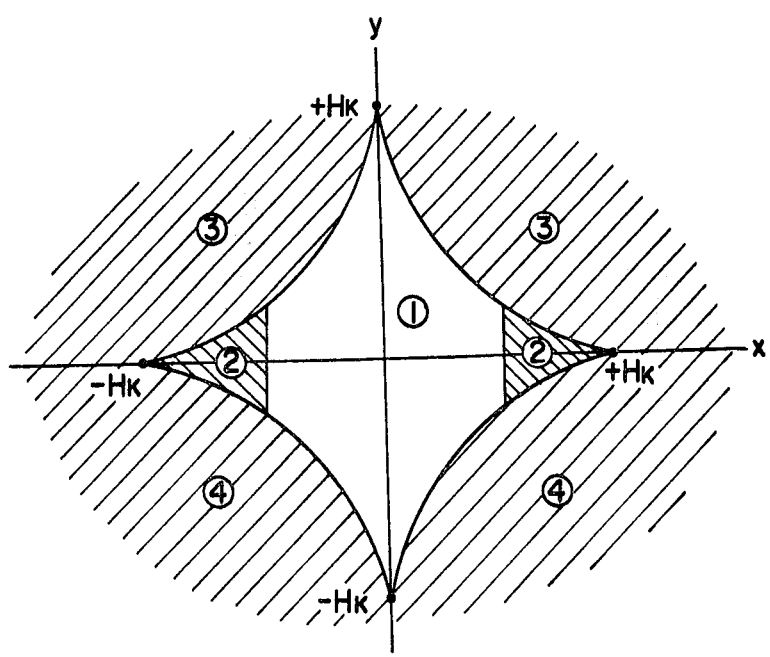

FIG. 4 shows the relationship between the inversion of magnetization and the magnetic field intensity in a magnetic field of rectangular coordinates. Where a magnetic field $|Hx|$ lower in intensity than that $|Hk|$ in the direction $x$ is excited with the lapse of time, if no magnetic field is present in the direction $y$, the magnetization vector $\vec{M}$ exists in a domain ① with the result that no inversion of magnetization occurs. If, now, the magnetic field $|Hy|$ is of a magnitude to enter, with regard to its polarity, either domain ③ or ④ of inversion of magnetization, as shown in FIG. 4 is applied in the direction $y$, magnetization is inverted according to the polarity thus applied in the magnetic field of the direction $y$ corresponding to the domain ③ or ④ thus providing such an output voltage as depicted in FIG. 3B. Even where the value of the magnetic field $|Hx|$ is a little smaller than that of $|Hk|$, that is, even where no magnetic field is applied in the direction $y$ in the domain ② the inversion of magnetization is positively affected by magnetic domain wall displacement. Where the value of the magnetic field $|Hx|$ further increases to exceed that of $|Hk|$, if no weak magnetic field exists in the direction $y$, the domains ③ and ④ are selected in some probability, so that the phase of the output voltage is very unstable.

As described above, the domain ① is an oscillation suspending domain and the neighboring domains ③ and ④ are magnetic oscillation domains in which the phase of the output voltage is determined dependent on the intensity and polarity of the external magnetic field. Accordingly, if the $x$-direction magnetic field $Hx$ established by the excitation in the domain ① is set to oscillate or rest in the neighborhood of the boundary in FIG. ④ by simultaneously applying or not applying respectively a $y$-direction external magnetic field of a magnitude suitably selected with respect to the magnitude of $Hx$, as may be seen from FIG. 4, oscillation and suspension of oscillation, respectively can easily be reversed by applying a weak magnetic field to be detected in the same direction as or in the reverse direction to the aforesaid external magnetic field, thus detecting the magnetic field. Further, it is also possible to generate a pulse, for example, by applying a $y$-direction positive magnetic field to cause the $x$-direction magnetic field $Hx$ in the domain ① to oscillate in the domain ③ and then applying a $y$-direction but negative magnetic field substantialy equal in intensity to the above positive one to shift the $x$-direction magnetic field $Hx$ to the domain ④ thus reversing its phase.

A description will be given of examples of this invention based on the above principles.

FIG. 5 shows a magnetic sensor wherein a detecting coil 2 is wound about a magnetic thin film plated wire 1 of uniaxial magnetic anisotropy which has a magnetic hard axis in its axial direction and a magnetic easy axis in its circumferential direction. An exciting current $I_f$ is applied to a core conductor of the magnetic wire 1. A tuning capacitor 3 is connected in parallel with the detecting coil 2 and a DC bias current $I_{DC}$ is applied in parallel to the circuit of capacitor 3 and the detecting coil 2 through an impedance element 4 for generating a magnetic line of force in the direction of the magnetic hard axis of the magnetic wire 11. Namely, an exciting current of about 1MHz and 60mA is applied as the exciting current $I_f$ to the wire 1 carrying the thin magnetic film. The film may comprise permalloy plated about $1\mu$ thick on a phosphor bronze wire of $0.2\phi$. A magnetic circuit including the magnetic hard axis of the magnetic wire 1 is formed, for example, when a magnet 6 is disposed in the neighborhood of the magnetic wire 1 to provide a magnetic circuit in the air including the magnetic hard axis of the magnetic thin film on wire 1. As a result, the magnetic field of the magnet enters in the oscillation domain of parametric oscillation to produce an output voltage 0.4 volts of 2MHz between output terminals 5 and 5'. In this illustrative case, the number of turns of the detecting coil 2 is 60 and the capacitance of the tuning capacitor 3 is 8000PF.

Then, the DC bias current $I_{DC}$ is impressed to the detecting coil 2 in such a manner that the resulting solenoid magnetic field may become opposite in polarity to the magnetic field established by the magnet. By an appropriate selection of the magnitude of the DC bias current $I_{DC}$, the output voltage derived between the terminals 5 and 5' becomes zero to stop the oscillation output. This state is equal to such a state that the external DC magnetic field due to the magnet and the internal DC magnetic field due to the DC bias current $I_{DC}$ cancel each other in the magnetic wire 1 to impress no magnetic field thereto. Namely, a balancing system of the magnet 6 and the DC bias current $I_{DC}$ is established to stop the oscillation output. Under such conditions, if a magnetic substance 7 is shifted from a position $a$ to a position $b$ adjacent to this system as shown in FIG. 5, the magnetic flux from the magnet 6 is concentrated in the magnetic substance 7 to cause a substantial decrease in the intensity of the effective magnetic field passing through the magnetic wire 1. As a result of this, the equilibrium state of the system is lost and an output voltage is produced between the terminals 5 and 5' by the effective bias component resulting from the difference between the internal DC magnetic field and the external DC magnetic field. Namely, it is possible to detect approach of the magnetic substance 7 by the generation of the output voltage between the terminals 5 and 5'.

FIGS. 6A and B illustrate how the output voltage is generated between the terminals 5 and 5' in FIG. 5. FIG. 6A corresponds to the state in which the magnetic substance 7 assumes the position $a$ depicted in FIG. 5 and the balancing system is established, while FIG. 6B shows an output voltage waveform of a frequency $2f$ which is produced between the terminals 5 and 5' when the magnetic substance 7 assumes the position $b$ to lose the equilibrium state. In the present example, the DC bias current $I_{DC}$ is impressed to establish the internal DC magnetic field but it is also possible, of course, to impress a magnetic field of the same intensity as the above-mentioned by means of a permanent magnet.

Also in the case where the aforesaid DC bias current is not impressed to establish the internal DC magnetic field, detection of the magnetic substance is possible. Namely, when the magnetic substance 7 is not in the position $b$, the magnetic field by the magnet 6 is always impressed to produce an oscillation output voltage between the terminals 5 and 5'. For the detection of the magnetic substance 7, it is sufficient merely to set the relative arrangement of the magnet and the magnetic substance in such a manner that when the magnetic substance 7 is brought near the magnet 6, the effective bias component of the magnet 6 applied to the magnetic wire 1 is decreased to reduce the oscillation output voltage between the terminals 5 and 5' to zero.

With this method, the generation and suspension of the output voltage due to the approach of the magnetic substance 7 are opposite to those in the case described above with regard to FIG. 6.

FIG. 7 shows the case in which the magnetic substance 7 is magnetically coupled with the magnet 6 and is used as a magnetic shield with respect to the magnetic circuit including the magnetic hard axis of the magnetic wire 1. Namely, when the magnetic substance 7 assumes the position $a$, the magnetic field of the magnet 6 is impressed to the magnetic wire 1 to produce an oscillation output voltage between the terminals 5 and 5'. When the magnetic substance 7 is brought to the position $b$, the magnetic flux from the magnet 6 is concentrated in the magnetic substance 7 and does not reach the magnetic wire 1, with the result that the oscillation output between the terminals 5 and 5' is reduced to zero. FIGS. 8A and 8B show waveforms which are obtained when the magnetic substance 7 lies at the positions $a$ and $b$ in FIG. 7 respectively, and the waveforms are opposite in order to those in the case of FIG. 6. This example utilizes the magnetic shield by the magnetic substance 7 and can be used in a proximity switch, a pulse generator and other apparatus other than the magnetic substance detector.

FIG. 9 illustrates another example of this invention as being applied to a simple pulse generator. A gear 8 formed of a magnetic material is disposed between a magnetic sensor 10 and a magnet 6. When the gear 8 is turned once, the magnetic flux from the magnet 6 is intercepted by the teeth of the gear 8 but not intercepted by the grooves between the teeth, so that output pulses equal in number to the teeth can be obtained. The magnetic sensor 10 has the construction of FIG. 7 which includes the magnetic wire 1, the detecting coil 2 and the tuning capacitor 3. An exciting circuit 11 is a circuit for supplying the magnetic wire 1 with a current having a frequency of 1MHz and an amplifying and detecting rectifier circuit 12 is a circuit for converting the sensor oscillation output voltage having a frequency of 2MHz into a pulse.

FIG. 10 shows another example of the magnetic substance detecting device of this invention as being applied to a analog-to-digital converter. In this figure, reference number 27 indicates a disc-shaped rotary member, which has a plurality of magnets 25 (four in the figure) mounted thereon at its peripheral portion. Reference numeral 29 designates a magnetic sensor as will be described in connection with FIG. 16, which is disposed in the neighborhood of the rotary member 27. When the rotary member 27 turns to bring the magnets 25 near the magnetic sensor 29, the magnetic sensor 29 oscillates and the oscillation voltage therefrom is fed to an amplifying detector circuit 30 connected to the magnetic sensor 29 to derive a pulse from an output terminal 31. Namely, a rotational displacement can be converted into a pulse.

While the present example has been described above in connection with the case where the magnets 25 are mounted on the rotary member 27, it is also possible to magnetize the periperal portion of the rotary member 27 itself at a plurality of areas. Namely, it is sufficient that the rotary member has a plurality of magnetized areas.

Thus, the analog-to-digital converter of this invention employs a magnetic sensor comprised of a thin film plated wire and hence is small and, in addition, since it is actuated only according to the presence of an external magnetic field, it is excellent in performance.

Further, where the magnets 25 (or magnetized areas) of the rotary member are closely spaced as shown in FIG. 11A, and are arranged to be opposite in polarity to adjacent ones, as depicted in FIG. 11B, it is possible to effect analog-to-digital conversion with high resolution. Referring again to FIG. 10, the magnets 25 may be of any desired polarity as regards the poles disposed toward the sensor 29. However, to assure that the sensor does switch from the oscillation to non-oscillation state, it is preferred to alternate the polarity of the successive magnets and hence the alternate poles N and S are indicated for the successive magnets 25 disposed about the periphery of the member 27.

FIG. 12 illustrates another example of this invention as being applied to a precision measuring device for converting a mechanical displacement into a digital electrical signal, in which a projection 34' of a table 34 is threadably engaged with a screw rod 33 which is driven by a drive motor 32. A gear $G_1$ is provided at one end of the screw rod 33, with which a gear $G_2$ meshes, and a rotary member 27 having mounted thereon magnets 25 is attached to the gear $G_2$ through a shaft 35 in such a manner as to rotate simultaneously with the gear $G_2$. Reference numeral 29 indicates a magnetic sensor provided in proximity to the rotary member 27, and numeral 30 designates an amplifying and detecting rectifier circuit connected to the magnetic sensor 29, the output from which circuit 30 is counted by a counting indicator circuit 36.

In this measuring device, when the screw rod 33 is driven by the drive motor 32, the table 32 is moved in a lateral direction, so that the displacement of the table 34 can be known from the number of pulses indicated by the counting indicator circuit 36. Namely, if the total displacement of the table is divided at an appropriate pitch and if the respective dividing points are caused to correspond to pulse signals indicated by the counting indicator circuit 36 respectively, the displacement of the table can be known by counting the pulse signals. For example, if the displacement of the table 34 is Xmm and if 1,000 pulses are generated for one rotation of the rotary member 27, the detecting accuracy is X/1,000mm. It is a matter of course that an increase in the number of the dividing points enables more accurate detection of the position of the table.

FIG. 13A shows an example of the rotary member 27 on which an appropriate number of magnets 25 are mounted at appropriate positions. As shown in FIG. 13A, the disc 27 includes eight equally spaced positions about its periphery. At selected ones of those positions there is mounted a permanent magnet, as illustrated at $25_1$ through $25_5$. Such a structure is usable in a sequence control circuit. For example, a further disc such as 27 may include a magnet at each position such that during rotation at a constant speed there is produced a pulse at each of eight equally spaced positions in response to the eight equally spaced magnets with result of generating a wave form as shown in FIG. 13B. The disc having selected magnets $25_1$ through $25_5$ on the other hand will produce a wave form as shown in FIG. 13C, wherein the individual pulses are identified by corresponding numerals in relation to the magnets which cause the generation of those pulses. This sequence control can be attained merely by mounting the magnets on the rotary member (or magnetizing the rotary member); programming is easy in that the program can easily be changed by changing the position of the magnets 25 on rotary member 27. Further, the device of this invention is contactless, and hence has a long service life.

Moreover, where the rotary member 27 is concentrically divided into four blocks (i.e., radially displaced annular regions) $27_1$, $27_2$, $27_3$ and $27_4$ to provide four bits as shown in FIG. 14, a binary unit from 0 to 9 is obtained for the set of magnets as selectively provided along a given angular direction or radius, (the figure showing an example of an 8-4-2-1 code), so that more complicated programming is possible and the device of this invention can also be employed as a numerical value setting switch for machine tools, measuring instruments and so on. As has been previously mentioned with regard to FIG. 10, the polarities of the magnets may be selected as desired. However, alternating the poles as disposed toward the sensor serves to assure that the sensor switches from an oscillation to a non-oscillation state and hence it is preferred that the successive magnets be of respectively opposite polarities as disposed toward the sensor.

Further, the magnetic sensor can also be used for detecting the number of bowling pins. Namely, as shown in FIG. 15, a magnet 45 embedded in the top of a pin 47 is detected by a magnetic sensor 29 and the detected output is fed to an amplifying and detecting rectifier circuit 30 whose output energizes a lamp indicator circuit 36.

The foregoing examples are of the type that only when the magnetic sensor approaches the magnet, oscillation and suspension of the oscillation output are changed over. However, the present invention can be used as an analog-to-digital converter of the type that the magnetic sensor is always held in its oscillating condition and a magnet is brought near the magnetic sensor to apply a magnetic field in the direction of the magnetic hard axis of the magnetic wire to reverse the phase of the oscillation.

Figure 16:
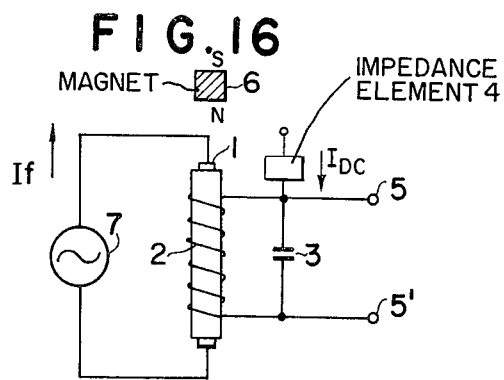
FIGS. 16 to 19B, inclusive, are schematic diagrams, for explaining the constructions and functions of other examples of this invention as being applied to other types of analog-to-digital converters.
Figure 17A:
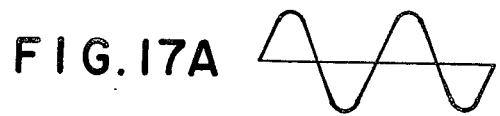
Figure 17B:
Figure 17C:
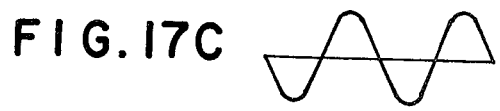

As illustrated in FIG. 16, an exciting current $I_f$ is applied from an exciting power source 7 to a magnetic sensor similar to that in FIG. 5 to produce an oscillation output. As discussed in relation to FIG. 5, an impedance element 4 is connected from an energizing circuit to the junction of the input lead from terminal 5 to coil 2 and the connecting lead of capacitor 3 to supply a DC bias current $I_{DC}$ in parallel to the circuit of capacitor 3 and the detecting coil 2 for generating a magnetic line of force in the direction of the magnetic hard axis of the magnetic wire 1. Depending upon the sense of the winding of coil 2, for a given bias current polarity as illustrated by the arrow adjacent the bias current indication $I_{DC}$, and by reference to FIG. 4, it will be seen that the thin film of the sensor is magnetized in a corresponding one of the domains 3 or 4. As the magnet 6 is brought near one end of the magnetic wire 1 to apply its magnetic field as an external magnetic field in the direction of the magnetic hard axis of the magnetic wire 1 and thus of the sensor, the oscillation phase can be controlled with the polarity of the magnetic field. For illustrating this effect, the magnet 6 is shown to have its pole N disposed toward the wire 1 such that the magnetic field of the magnet 6 opposes the magnetic field produced by the current $I_{DC}$ thereby to switch the magnetization of the thin film from the domain determined by the current $I_{DC}$ to the opposite domain. In FIG. 4, illustratively, this could correspond to a switch from domain 3 in which the film is magnetized in the absence of magnet 6 to domain 4 into which the film is magnetized in response to magnet 6 being brought near the end of wire 1 and thereby coupling its opposing magnetic field in the direction of the hard axis of the film. Accordingly, a reversal of the phase of the oscillation is produced in response to the magnet 6 approaching the sensor. There results a zero voltage output in the coil 2 as the magnetization switches from one to the other domain and the oscillation corresponding by switches phase, which zero voltage output is detected as a pulse occuring between the two phases of oscillation as an indication of the sensor's detecting the magnetic field. For example, a 0 phase in which the output oscillates in the absence of the magnet 6 is reversed to a $\pi$ phase in the case where the magnet 6 lies adjacent to the magnetic sensor as depicted in FIG. 16. Thus, when the phase is reversed from 0 to $\pi$ and vice versa, oscillation output voltages between the terminals 5 and 5' of the detecting coil becomes such as depicted in FIGS. 17A, 17B and 17C respectively. Namely, the oscillation output voltage of the 0 phase in the absence of the magnet 6 corresponds to FIG. 17A, the output voltage of the $\pi$ phase corresponds to FIG. 17C and when the phase is reversed from that of FIG. 17A to that of FIG. 17C and vice versa, the oscillation output voltage always becomes zero as depicted in FIG. 17B. Based on the condition shown in FIG. 17B in this context, it will be appreciated that the 0 phase of the oscillation output voltage is established by appropriate selection of the bias current $I_{DC}$, this invention is to produce a pulse utilizing the fact that the oscillation output voltage becomes zero when its phase is reversed.

Figure 18:
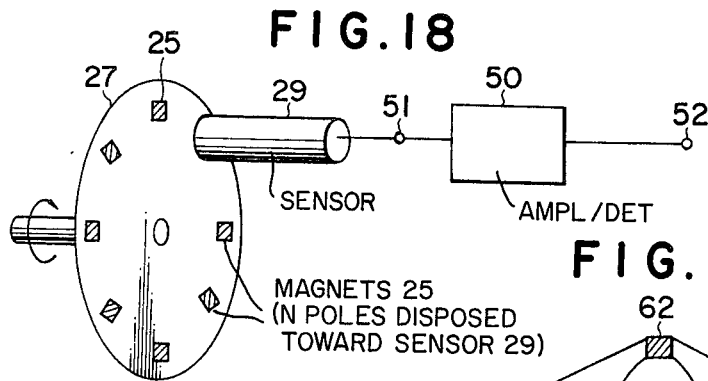

FIG. 18 illustrates an analog-to-digital converter of the phase inversion type embodying this invention. A plurality of magnets 25 are mounted on a rotary disc 27 similar to that in FIG. 10, and the magnets 25 are arranged in such a direction as to reverse the initial phase of a magnetic sensor 29. Namely, assuming that the initial phase of the magnetic sensor 29 is 0, when the rotary disc 27 is driven to rotate to bring the magnet 25 near the magnetic sensor 29, the magnetic sensor 29 oscillates in the $\pi$ phase and when the magnet 25 is moved away from the magnetic sensor 29, the oscillation phase of the magnetic sensor 29 is reversed again to the initial phase 0. Accordingly, a second harmonic oscillation output voltage whose phase is alternately reversed in an order of 0, $\pi$, 0, . . . is produced at a terminal 51. The oscillation output voltage becomes zero in the course of each phase inversion, so that, by shaping the waveform of the output voltage with an amplifying detector circuit 50, the phase inversion can be derived in the form of a pulse at a terminal 52.

Figure 19A:
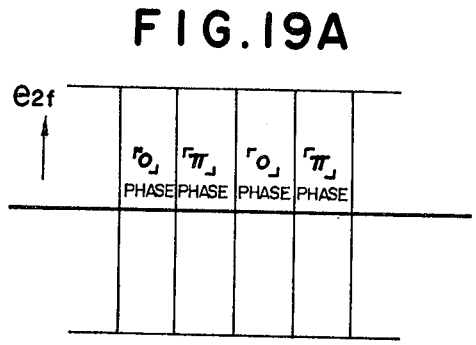
Figure 19B:
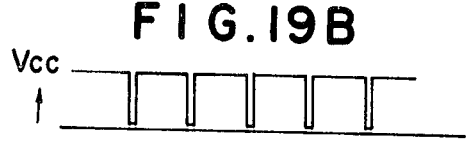

FIGS. 19A and 19B show a second harmonic oscillation waveform $e_{2f}$ at the terminal 51 and a pulse waveform Vcc at the terminal 52 in FIG. 18. FIGS. 19A and 19B show that the waveforms are coincident in time base with each other and that an output pulse is obtained at the time of phase inversion. In this case, pulses twice as many as the magnets 25 are obtained for every rotation of the rotary disc 27 in FIG. 18.

Since the magnetic substance detecting device of this invention utilizes the conditions of the oscillation output being zero at the time of phase inversion as has been described above, the response speed is dependent on the magnetization mechanism of the magnetic thin film wire and hence is extremely high. Further, the sensitivity of the magnetic substance detecting device of this invention is higher than that of conventional devices of this kind. Namely, because the oscillation output is produced in the one phase in the absence of the magnet but its phase is reversed to the other phase when the magnet approaches the magnetic sensor, the detecting device of the invention responds to an extremely slight external magnetic field and its sensitivity is far higher than that obtainable with the prior art devices which, for example, when excited produce no oscillation output if an external field is not provided and, conversely, produce an oscillation output only when the external magnet approaches the magnetic sensor and its external field when coupled thereto generates oscillations. Where high sensitivity is not required, it is also possible, of course, to employ such a method that the exciting current is set small immediately before oscillation and the DC bias current is impressed to the detecting coil to cause oscillation in a certain phase. The phase in this case is dependent on the polarity of the DC bias current.

The magnetic substance detecting device of this invention responds only when the magnetic field inverting an initial phase is applied in the direction of the magnetic hard axis of the magnetic wire. Accordingly, unless the magnets which are brought to the vicinity of one end of the magnetic wire in the axial direction are all of the same polarity, the magnetic substance detecting device does not respond, so that polarity detection as well as magnetic detection can be achieved by utilizing the above fact. Specifically, it will be understood that in FIGS. 16 through 18, the polarity of the magnet or magnetic substance being detected by the sensor must be such as to oppose the preferential biasing of the sensor into a given domain such that the magnet, when approaching the sensor, causes that preferential magnetization in a first domain to switch to the opposite domain. It furthermore will be apparent that the circuits and systems of FIGS. 16 through 18 do not require a north pole rather than a south pole of the magnet to be disposed toward the sensor, but that the requirement is merely the polarity of the magnet be in opposition to the preferential magnetization provided by the bias current $I_{DC}$. Thus, dependent on the sense of the winding of the detecting coil 2 and the polarity of the bias current, the appropriate pole of the magnet is selected to be disposed toward the sensor 2. For purposes of polarity detection, it as well will be apparent that two such sensors as in FIG. 16 may be provided with opposite preferential biasing of the respective magnetic films such that separately detectable outputs in accordance with the polarity of a magnet to be detected are provided, thus affording polarity detection as above noted in addition to magnetic detection per se, regardless of polarity of the external magnetic material, shown as magnet 6.

In the case where a magnetic substance to be detected is formed of a ferrite, the magnetic substance detecting device of this invention can be used as a temperature sensor switch. A magnetic device such as ferrite or the like is rearranged from a ferromagnetic material to a paramagnetic material at a temperature in the range of −30° c to 200° c, usually 80° c to 150° c and does not exhibit magnetic properties as is well-known. This temperature is called Curie temperature. It is possible to achieve temperature control by utilizing such a characteristic. Namely, the above-mentioned temperature is detected by coupling a magnetic core with a magnetic or electrical circuit associated with the magnetic oscillation domain of the magnetic sensor and by changing over the oscillation and suspension of the oscillation output of the detecting coil of the magnetic sensor when the ambient temperature of the magnetic core passes through the Curie temperature.

Figure 20:
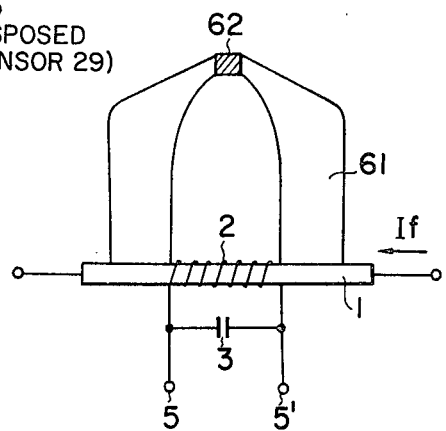
FIGS. 20 to 22, inclusive, are schematic diagrams illustrating the constructions of other examples of this invention as being applied to a temperature sensor switch in which a magnetic core is provided in a magnetic circuit.
Figure 21:
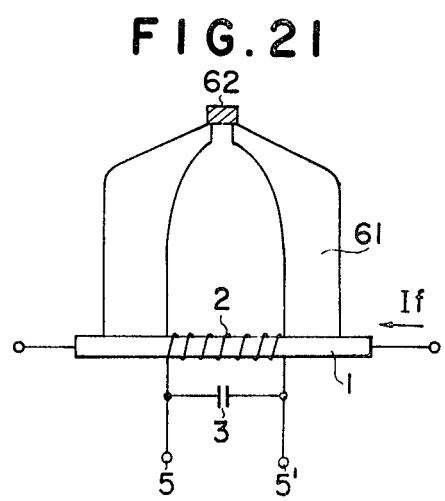

In FIG. 20, a magnetic sensor comprising a magnetic thin film wire 1 of uniaxial magnetic anisotropy having a magnetic hard axis in its axial direction and a detecting coil 2 wound thereon is provided; a ferrite yoke core 61 having a magnet 62 disposed at the top thereof is arranged in contact with both end portions of the magnetic wire 1 to form a closed magnetic path; and a capacitor 3 is connected in parallel to the detecting coil 2. An exciting current $I_f$ of a frequency $f$ is applied to the core conductor of the magnetic wire 1. The core 61 and the magnetic wire 1 may also be bonded together by an adhesive binder composed of a resin and powdered ferrite so as to suppress lowering of the permeability due to a gap. In FIG. 21, the magnet 62 is mounted on the gap at the top of the ferrite yoke core 61. In the present invention, the closed magnetic path is formed by the ferrite yoke core 61 and the magnet 62 in the direction of the magnetic hard axis of the magnetic wire 1 as described above. At temperatures below the Curie temperature, the magnetic flux from the magnet 62 is drawn in the ferrite yoke core 61 by the ferromagnetic characteristic of the ferrite yoke core 61 and impressed in the direction of the magnetic hard axis of the magnetic wire 1 to produce an output voltage of a frequency $2f$ between terminals 5 and 5' of the coil 2. However, when the Curie temperature has been reached, the ferromagnetic characteristic of the ferrite yoke core 61 rapidly disappears and the magnetic flux from the magnet 62 is so set as not to reach the direction of the magnetic hard axis of the magnetic wire 1 only with the magnet 62, so that no oscillation output is derived between the terminals 5 and 5'. According to our experimental results, the switching operation at the Curie temperature is possible with an accuracy of ±1° c. The magnetic substance detecting device of this invention is contactless and thus more reliable and can be adapted for a wide range of uses as a high precision and reliable temperature sensor switch.

Figure 22:
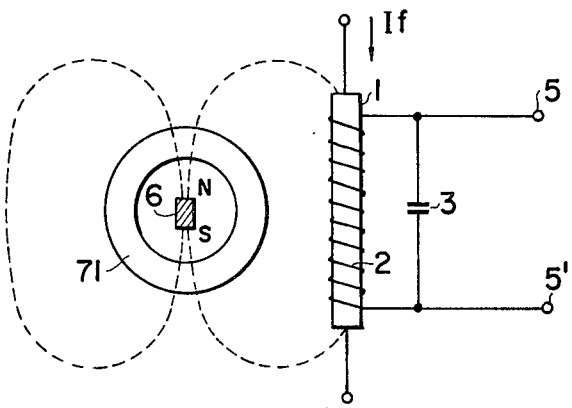

FIG. 22 shows another modified form of the temperature sensor switch according to this invention. The magnetic wire 1, the detecting coil 2 wound thereon, the terminals 5 and 5', the capacitor 3 connected in parallel with the detecting coil 2 and the exciting current $I_f$ of the frequency $f$ are the same as those in the examples of FIGS. 20 and 21. The magnet 6 is disposed at an appropriate position relative to the magnetic wire 1 and a magnetic line of force emanating from the magnet 6 is applied in the direction of the magnetic hard axis of the magnetic wire 1, thereby inducing an oscillation output of a frequency $2_f$ in the detecting coil 2. Where a ferrite ring core 71 is disposed about the magnet 6, the magnetic flux from the magnet 6 is concentrated into the ferrite ring core 71 and does not reach the direction of the magnetic hard axis of the magnetic wire 1 at temperatures below the Curie temperature and no detected output is produced. However, when the Curie temperature has been reached, the ferrite ring core 71 becomes paramagnetic and the magnetic flux is impressed in the direction of the magnetic hard axis of the magnetic wire 1 to derive an oscillation output between the terminals 5 and 5'. The switching operation with this method is also achieved with an accuracy of ± 1° c. Specially, molding the ferrite ring core is extremely easy, the core is spaced apart from the magnetic wire and no winding is required, so that the device of this example can be widely used as a Curie point measuring instrument or a temperature sensor switch, which is high in precision and in reliability (as is the case with the foregoing example) and is simpler in construction.

Figure 23:
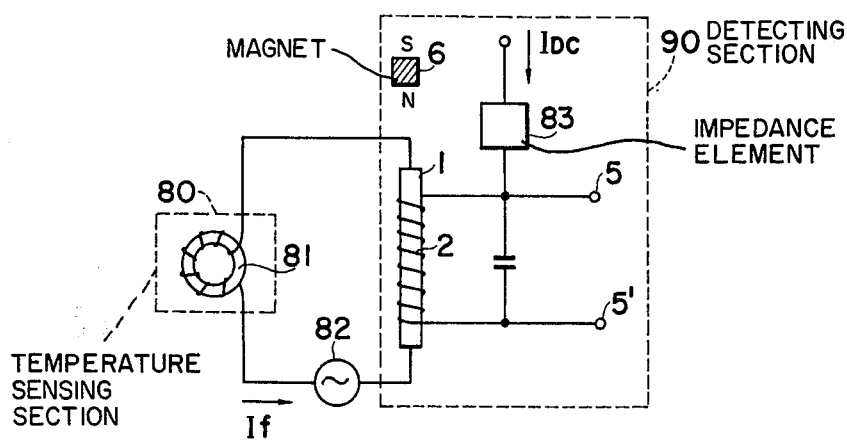
FIG. 23 is a schematic diagram showing the construction of another example of this invention as being applied to a temperature sensor switch in which a magnetic core is provided in an electrical circuit.

FIG. 23 illustrates another modified form of the temperature sensor switch according to this invention. The magnetic wire 1, the detecting coil 2 wound thereon, the terminals 5 and 5' and the capacitor 3 connected in parallel with the detecting coil 2 are the same as those in the foregoing examples. A temperature sensing section 80 is provided in an exciting circuit formed to pass current through the core conductor of the magnetic wire 1. A ferrite ring core 81 having wound thereon a winding is disposed in the temperature sensing section 80 and is connected in series with a 1MHz exciter oscillator 82. A magnet 6 may be disposed to impress an external magnetic field in the direction of the magnetic hard axis of the magnetic wire 1 having the detecting coil 2 wound thereon. A DC bias current $I_{DC}$, which applies a DC magnetic field equivalent to the magnet 6, is always applied to the coil 2 through an impedance element 83. In this case, it is also possible to employ both of them, fix the magnet 6 and make the impedance element 83 variable for fine adjustment. The magnetic sensor including the detector circuit is indicated as a detecting section 90 surrounded by a broken line.

The magnetic sensor is set so that when the ferrite ring core 81 is not connected thereto, an exciting current of a frequency $f$ flows in the magnetic wire 1; thus, the sensor becomes coupled with an external DC magnetic field perpendicular thereto and enters the magnetic oscillation domain to produce an oscillation output of a frequency $2_f$ between the terminals 5 and 5' of the detecting coil 2. It is also possible to flow a larger amount of the exciting current $I_f$ and hold oscillation without impressing any external magnetic field at all times. Where the ferrite ring core 81 is connected to the magnetic sensor, if the temperature sensing section 80 is at a temperature below the Curie temperature, the ferrite ring core 81 acts as an inductance component of the exciting circuit and the exciting current $I_f$ flowing in the magnetic wire 1 becomes extremely small and no oscillation output is obtained between the terminals 5 and 5'. When the Curie temperature has been reached, the ferromagnetic characteristic of the ferrite rapidly disappears and the exciting current $I_f$ becomes substantially equal to that in the case where the ferrite ring core 81 is not connected to the magnetic sensor, thus, producing an oscillation output voltage between the terminals 5 and 5'. Namely, this method utilizes a change in the inductance component of the ferrite for switching of the exciting current, thereby detecting the Curie temperature of the ferrite. With this method, a small ferrite ring core can be used, the number of turns on the core may be small and the temperature sensing section 80 and the detecting section 90 can be spaced apart from each other, so that this method can be employed for measuring the Curie point of a magnetic material of high Curie point such, for example, as permalloy or the like. According to our experimental results, the switching operation with this method responds with high accuracy of less than $\pm 1°C$ and reproducibility is also excellent. Further, the device of this example is also contactless and simple in construction, and hence high in reliability as is the case with the foregoing examples.

As has been described in the foregoing, where the temperature of the magnetic core is below the Curie point, the closed magnetic path is formed by the magnet and the magnetic core in the direction of the magnetic hard axis of the magnetic wire to produce an oscillation output in the examples of FIGS. 20 and 21. In the example of FIG. 22, a line of magnetic force capable of producing oscillation, impressed by the magnet in the direction of the magnetic hard axis, is shielded by the magnetic core at temperatures below Curie point to stop the oscillation. Further, in the example of FIG. 23, the exciting current is decreased by means of an inductance core inserted in the exciting circuit to stop the oscillation. However, when the temperature of the magnetic core has reached the Curie point, the ferromagnetic property of the magnetic core disappears to stop the oscillation in the aforesaid first example but produce an oscillation output in the second and third examples. Thus, the oscillating and suspending states can be reversed and the temperature therefor can be altered in the range of $-30°c$ to $200°c$, usually $80°c$ to $150°c$ according to the kind of the magnetic material used. Accordingly, coupled with the aforementioned advantages such as extremely high accuracy in response to temperature and high reliability because of the contactless and simple construction, the temperature sensor switch of this invention can effectively be employed not only for measuring the Curie point but also for temperature control or the like.

It will be apparent that many modifications and variations may be effected without departing from the scope of the novel concepts of this invention.

What is claimed is:

1. An apparatus for detecting an external magnetic field, comprising:

a magnetic sensor comprising an elongated member of an electrically conductive material and a thin magnetic film disposed thereabout and formed of an uniaxial magnetic anisotropic material having a magnetic hard axis disposed essentially parallel to the axis of said elongated member and a magnetic easy axis disposed about the circumference of said elongated member, and a detection coil wound about said elongated member, said magnetic sensor producing parametric oscillations and having first and second oscillation states of respectively opposite phase and a non-oscillation state, in accordance with selective magnetization of said thin film in corresponding ones of first and second oscillation domains and a non-oscillation domain, first means for producing an alternating magnetic field along said easy axis of an intensity to establish magnetization of said thin film in an oscillation domain, said first means includes further means for producing a magnetic field along said hard axis for establishing magnetization of said thin film in a desired one of said first and second oscillation states, second means for producing an external magnetic field, and third means for moving said second means relatively to said sensor to provide adjacent positions thereof wherein the external magnetic field of said second means is coupled to the direction of said hard axis of said sensor and produces magnetization of said thin film in a different one of said domains, and a displaced position wherein the external magnetic field of said second means is not coupled to said sensor and said thin film thereof is magnetized in said given domain, whereby said magnetic sensor changes its state from that corresponding to magnetization of said thin film in said given domain to a state corresponding to magnetization of said thin film in said different domain, said second means produces an external magnetic field of an intensity and polarity such that in said adjacent position thereof to said sensor, said external magnetic field switches the magnetization of said thin film to the other of said first and second oscillation domains, whereby said sensor changes from said one to said other of said first and second oscillation states of respectively opposite phases when said magnetization switches from said one to said other of said oscillation domains, said detecting coil producing an oscillating voltage output in accordance with said sensor being in either of said first and second oscillating states and producing a zero voltage output when the sensor switches from one to the other of said first and second oscillation states of respectively opposite phase, and means receiving the output of said detecting coil and responding to the zero voltage output of said detecting coil when the oscillation state of said sensor changes from one to the other of said first and second oscillation states of respectively opposite phase to provide an indication of the detection by said sensor of an external magnetic field.

2. Apparatus for detecting an external magnetic field as recited in claim 1 wherein said further means of said first means comprises a current source for supplying a DC current of a given polarity to said detecting coil thereby to produce a magnetic field along said hard axis of said thin film to establish magnetization of said thin film in a given one of said first and second oscillation domains and thereby bias said sensor to oscillate in a corresponding one of said first and second oscillation states of opposite phase.

3. Apparatus for detecting the presence of the magnetic field as recited in claim 1 wherein said second means comprises a plurality of magnets each producing a corresponding external magnetic field and said third means comprises a rotating member for receiving said plurality of magnets disposed thereon at a given radius from the center of rotation thereof, said magnets being oriented on said rotating member with a common polarity such that rotation of said rotating member moves said magnets in succession into said adjacent positions and each said magnet correspondingly causing said sensor to oscillate in the other of said first and second states of oscillation of respectively opposite phase.

4. An apparatus for detecting an external magnetic field, comprising:

a magnetic sensor comprising an elongated member of an electrically conductive material and a thin magnetic film disposed thereabout and formed of a uniaxial magnetic anisotropic material having a magnetic hard axis disposed essentially parallel to the axis of said elongated member and a magnetic easy axis disposed about the circumference of said elongated member, and a detection coil wound about said elongated member, said magnetic sensor producing parametric oscillations and having oscillation states including first and second oscillation states of respectively opposite phase and a non-oscillation state, in accordance with selective magnetization of said thin film in corresponding ones of first and second oscillation domains and a non-oscillation domain, first means for establishing an alternating magnetic field along said easy axis of an intensity to produce an oscillation state of said sensor and including means for magnetizing said thin film along said hard axis thereof to produce a given one of said first and second oscillation states, second means for producing an external magnetic field, third means for moving said second means relatively to said sensor to provide adjacent and displaced positions of said second means and said sensor, the external magnetic field of said second means being of an intensity and a polarity such that when said second means is moved from said displaced to said adjacent positions thereof, the external magnetic field of said second means is coupled in the direction of the hard axis of said sensor and switches the magnetization of said thin film from said given one of said first and second domains to the other thereof, and when said second means is moved relatively to said sensor from said adjacent to said displaced positions thereof, the magnetic field of said second means is not coupled to said sensor and the magnetization of said thin film switches to said given one of said first and second oscillation domains, whereby the magnetic sensor switches from said first to said second oscillation state in response to said third means moving said second means relatively to said sensor from said displaced to said adjacent positions thereof, and switches from said second to said first oscillation state in response to said third means moving said second means relatively to said sensor from said adjacent to said displaced position thereof, said detecting coil producing a voltage output in accordance with the first and second oscillation states of said sensor and producing no voltage output at each switching of the oscillation state of said sensor, and means receiving the output of said detecting coil and responsive to each change from a voltage output to no voltage output thereof to produce a pulse output for indicating the detection by the sensor of an external magnetic field.

* * * * *

UNITED STATES PATENT AND TRADEMARK OFFICE
CERTIFICATE OF CORRECTION

PATENT NO. : 4,008,432
DATED : February 15, 1977
INVENTOR(S) : TAKAO SUGISAKI et al It is certified that error appears in the above—identified patent and that said Letters Patent are hereby corrected as shown below:

```
Column 3, line 16, after "polarity" change "thus applied
in the magnetic field" to --of the magnetic field thus
applied in--.
Column 3, line 37, change " ④ " to --4--.
Column 6, line 33, "table 32" should be --34--.
Column 8, line 13, "0" should be --"0"--.
Column 8, line 15, "π" should be --"π"--.
Column 8, line 17, "0 to π" should be --"0" to "π"--.
Column 8, line 21, "0" should be --"0"--.
Column 8, line 23, "π" should be --"π"--.
Column 8, line 39, "0" should be --"0"--.
Column 8, line 42, "π" should be --"π"--.
Column 8, line 45, "0" should be --"0"--.
Column 8, line 47, "0, π, 0," should be --"0", "π", "0",--.
Column 9, line 58, change "device" to --material--.
```

Signed and Sealed this

Third Day of May 1977

[SEAL]

Attest:

RUTH C. MASON
Attesting Officer

C. MARSHALL DANN
Commissioner of Patents and Trademarks